United States Patent
Maziewski

(10) Patent No.: US 9,813,830 B2
(45) Date of Patent: Nov. 7, 2017

(54) AUTOMATED EQUALIZATION OF MICROPHONES

(71) Applicant: Intel Corporation, Santa Clara, CA (US)

(72) Inventor: Przemyslaw P. Maziewski, Gdansk (PL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/125,666

(22) PCT Filed: Jun. 3, 2014

(86) PCT No.: PCT/PL2014/050034
§ 371 (c)(1),
(2) Date: Sep. 13, 2016

(87) PCT Pub. No.: WO2015/187042
PCT Pub. Date: Dec. 10, 2015

(65) Prior Publication Data
US 2017/0006399 A1   Jan. 5, 2017

(51) Int. Cl.
*H04R 3/04* (2006.01)
*H04R 29/00* (2006.01)
*H03G 5/16* (2006.01)

(52) U.S. Cl.
CPC ............ *H04R 29/004* (2013.01); *H04R 3/04* (2013.01); *H03G 5/165* (2013.01); *H04R 2430/03* (2013.01)

(58) Field of Classification Search
CPC .... H04R 3/04; H04R 29/004; H04R 2430/03; H03G 5/165

USPC .......... 381/58, 59, 92, 111, 122, 71.1, 94.1; 704/233
See application file for complete search history.

(56) References Cited

U.S. PATENT DOCUMENTS

| | | | |
|---|---|---|---|
| 2002/0039427 A1* | 4/2002 | Whitwell | H04R 1/1091 381/312 |
| 2011/0051950 A1* | 3/2011 | Burnett | G10L 21/0208 381/92 |
| 2014/0029753 A1* | 1/2014 | Lyu | H04R 29/004 381/58 |

FOREIGN PATENT DOCUMENTS

| | | |
|---|---|---|
| CN | 101437191 B | 8/2012 |
| CN | 102655628 A | 9/2012 |
| EP | 1591995 A1 | 11/2005 |

OTHER PUBLICATIONS

PCT Search report and written opinion in corresponding PCT application No. WO2015/187042 dated Jun. 3, 2014 (20 pages).

* cited by examiner

*Primary Examiner* — Melur Ramakrishnaiah
(74) *Attorney, Agent, or Firm* — Trop Pruner & Hu, P.C.

(57) ABSTRACT

An automated microphone calibration starts with reference microphone calibration. Measurements are scaled to sound pressure levels (SPLs). The reference microphone is positioned close to the internal microphones and their frequency responses are measured. Then delta calculation is done in selected sub-bands including reference microphone correction and then a correction filter is defined.

27 Claims, 7 Drawing Sheets

AUTOMATED EQUALIZATION OF MICROPHONES

BACKGROUND

Equalization involves boosting or attenuating levels of different frequencies in a signal. For example, a treble control that adjusts high frequency is one type of equalization.

In order to achieve high and uniform audio quality in telecommunication devices, their internal microphones may be properly equalized. Previously the equalization was done manually by an external test lab, requiring extended lab time and experienced engineers, generating higher costs.

BRIEF DESCRIPTION OF THE DRAWINGS

Some embodiments are described with respect to the following figures.

DETAILED DESCRIPTION

Equalization is done using a reference microphone and an external loudspeaker in some embodiments. Each internal microphone to be equalized is tuned to match the reference microphone's response to the same excitation generated via the external loudspeaker. Additionally, each internal microphone's equalization may also be amended with the inverse equalization characteristic of the reference microphone calculated against a chosen certification (e.g. Skype/Lync Unified Specification, Version 1.0, Published August, 2013). This way, the final equalization includes both the internal versus reference microphone delta and the correction required for the reference microphone to pass the chosen certification, in some embodiments.

Equalization may be calculated automatically. Compared to the current, manual approach, automatically calculated equalization requires less time (i.e. lower cost) and a more relaxed (i.e. less expensive) measuring setup in some embodiments. Additionally, it may offer more objective results.

Figure 1:
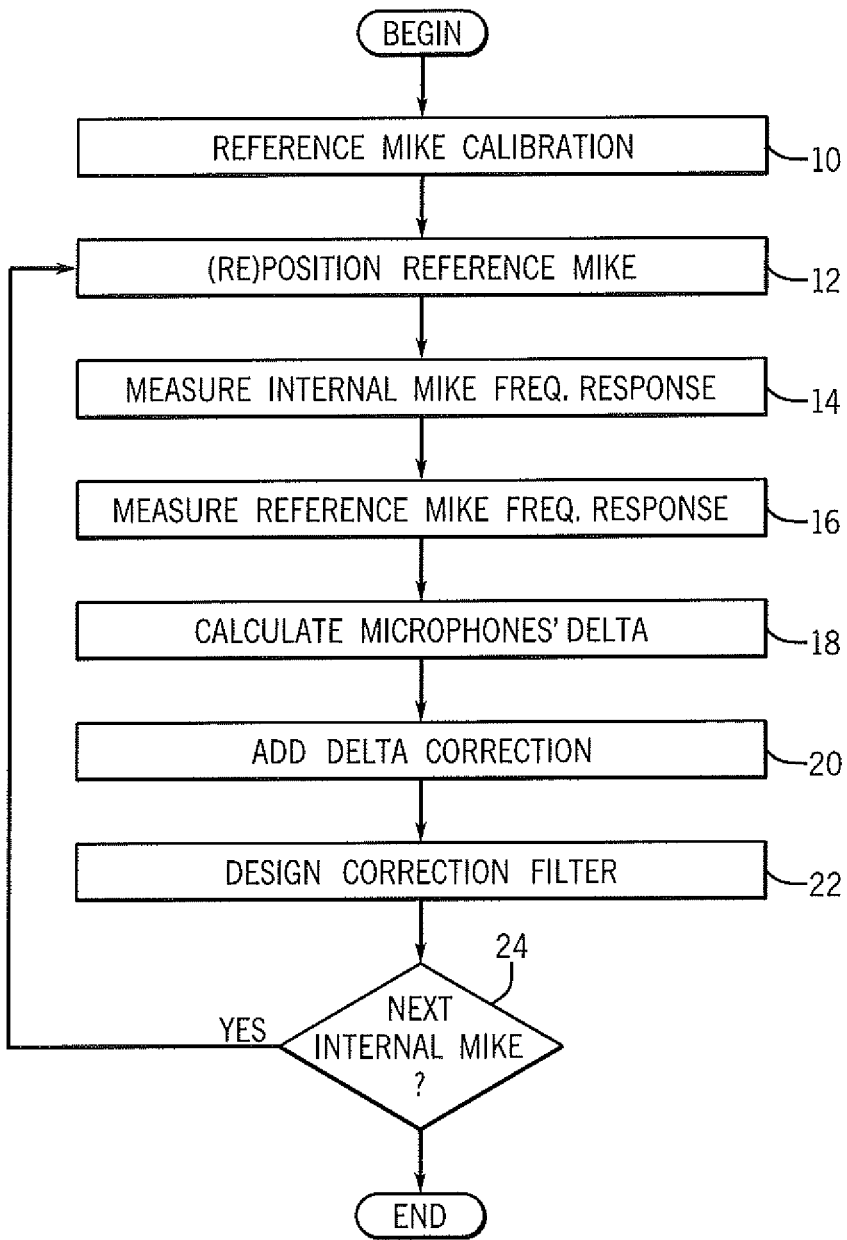
FIG. 1 is a flow chart for one embodiment.
Figure 2:
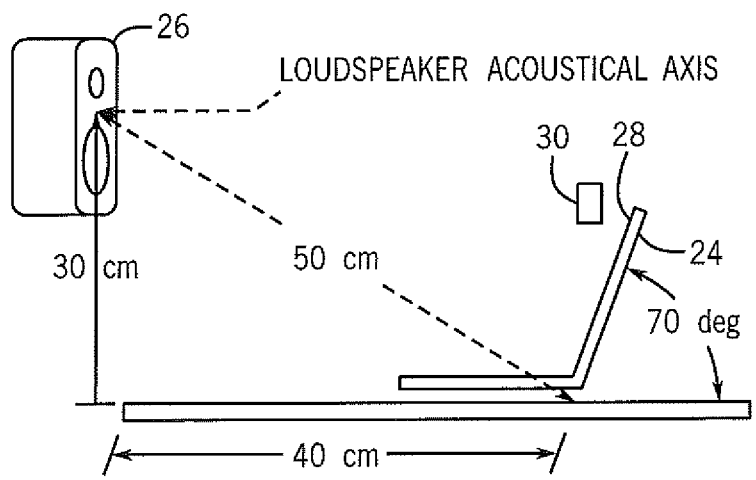
FIG. 2 is a side elevation of a test setup according to one embodiment.

Equalization is obtained for each internal microphone in an automated, iterative procedure shown in FIG. 1. The procedure can be executed in a setup compatible with the Skype/Lync Specification, as depicted in FIG. 2, or with a different certification setup. In the depicted example, the indicated distances between the computer in study 24 and the external loudspeaker 26 are compatible with the Skype/Lync speakerphone group testing setup.

In FIG. 2, a device under test, such as a computer 24, such as an ultrabook, has an internal microphone 28. A loudspeaker 26 plays audio that is picked up by the microphone 28 under test and the reference microphone 30. The loudspeaker may be driven by the device under test itself. The reference microphone provides an input signal to the device under test. Other microphone placements are possible, e.g. below or above keyboard, as well as other microphone orientations, such as a user facing or side (edge) facing orientation.

The set up shown in FIG. 2 requires no added equipment, other than a loudspeaker and a reference microphone, that may both be connected to the device under test. The ultimate correction calculation may also be done internally within the device under test, particularly, where the device under test has a digital signal processor with a filter, such as a finite impulse response filter, or where the operating system includes firmware or other code that would enable the necessary calculations to be done.

As a result, little external hardware is needed to implement relatively sophisticated testing, in some embodiments. Conventionally, systems use a sound quality head and torso simulator (HATS) with a variety of expensive and complex electronics for equalization. This can be replaced, in some embodiments described herein, through the addition of a relatively inexpensive loudspeaker and a reference microphone. Thus, in some embodiments, the tests may be entirely implemented using only the device under test, the reference microphone, and the external loudspeaker.

The procedure shown in FIG. 1 starts with reference microphone (mike) calibration (block 10). This step scales all following measurements to sound pressure levels (SPLs). A class 2 calibrator is sufficient for that purpose [International Electrotechnical Commission (IEC 60942), ed. 3.0]. The reference microphone should be able to capture the frequency band for which the final equalization will be applicable. In practice, a typical measurement microphone, like the Earthworks M30 (available from Earthworks, Milford, N.H. 03055), can be used in one embodiment.

The reference microphone is positioned (block 12) close to the internal microphone (see FIG. 2). A Cartesian robot can be used for full automation, however, in practice, this step can be done manually. Then, both the internal ($f_m$) and reference ($f_r$) microphones' frequency responses (blocks 14 and 16) are measured, in one embodiment, as the equivalent continuous sound level ($L_{Zeq}$) in one-third-octave-bands:

$$L_{Zeq}(T, n) = 20\log_{10}\left(\frac{\sqrt{\left(\frac{1}{\Delta t}\right)\int_T^{T+\Delta t} p_n^2(\varepsilon)d\varepsilon}}{p_0}\right) \quad (1)$$

where:
  $\varepsilon$ is a dummy variable of time integration over the averaging time interval,
  $p_n(\varepsilon)$ is the instantaneous sound pressure in n-th one-third octave band,
  $p_0$ is the reference sound pressure equal to 20 μPa,
  T is the start time of the measurement,
  $\Delta t$ is the averaging time interval, equaling 30 sec.

Figure 3A:
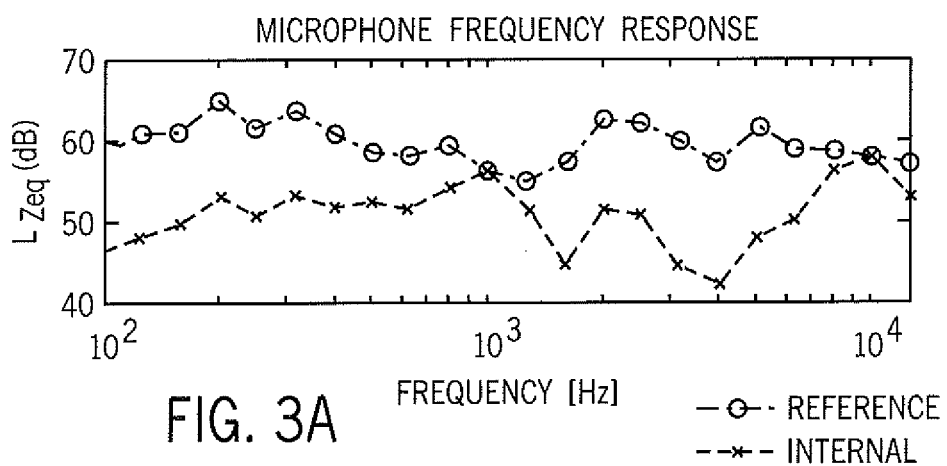
FIG. 3A presents frequency responses of exemplary reference and internal microphones.

The $f_m$ and $f_r$ are calculated from the 30 second response to the pink noise excitation generated in the ultrabook in study and played via the external loudspeaker (FIG. 3A).

A typical studio quality audio monitor, capable of reproducing the frequency band for which the microphone correction will be applicable, can be used as the loudspeaker. The measurement can be done in a typical room with a noise level up to 30 dBA. The $f_m$ is scaled to match the $f_r$, at the 1 kHz frequency. Then the microphones' frequency response difference or delta is calculated:

$$d(i)=f_r(i)-f_m(i) \quad (2)$$

where:
i is the number of the currently tested internal microphone,
$f_r(i)$ is the $L_{Zeq}(T, n)$ of the reference microphone positioned close to the i-th internal microphone (see FIG. 2),
$f_m(i)$ is the $L_{Zeq}(T, n)$ of the i-th internal microphone.

Delta calculation (block 18) is done only in the selected sub-bands requested in the certification, e.g. for Skype/Lync from 100 to 12500 Hz. An example of such analysis with Earthworks' reference microphone is given in FIGS. 3A (frequency responses) and 3B (microphones' delta d(i)).

Figure 4:
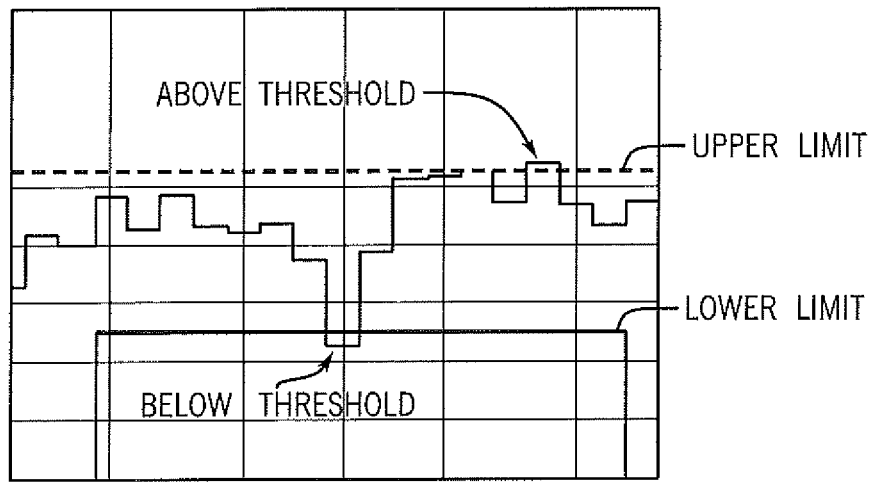
FIG. 4 is an exemplary reference microphone frequency response with acceptance thresholds.
Figure 5:
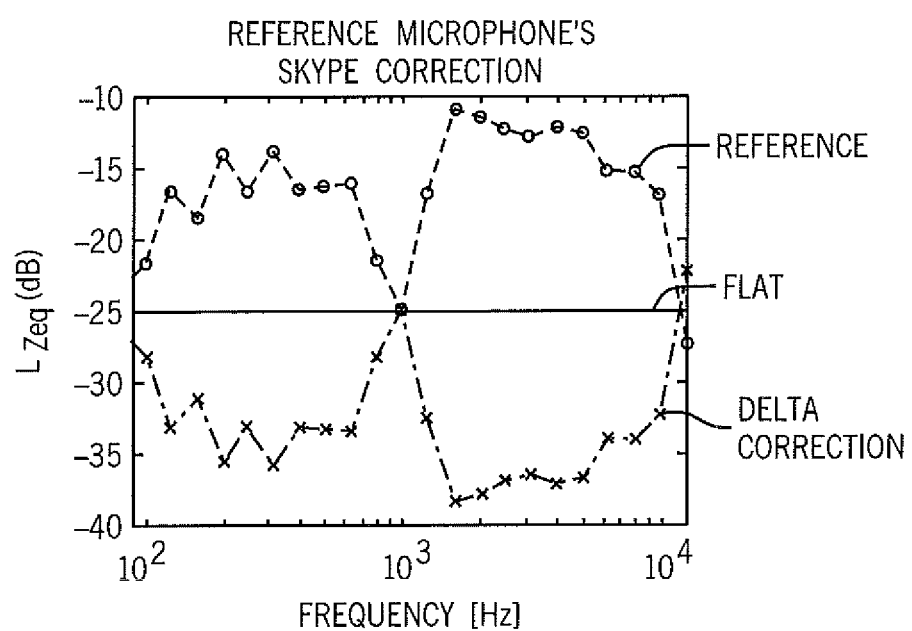
FIG. 5 is an exemplary reference microphone frequency response with its delta correction.

By default, the reference microphone does not pass the Skype/Lync frequency response tests (see FIG. 4) because it exceeds both the upper and lower threshold limits. It needs additional correction $d_r$, called the delta correction, which is constant per microphone position and can be calculated in advance using a generic mock-up. A mock-up is any device of that form-factor (it does not have to be electronically functional and the physical dimensions and their acoustical properties are important). The delta correction can be expressed as:

$$d_r(i)=f_{flat}(i)-f_{r\_mock}(i) \quad (3)$$

where:
$f_{r\_mock}(i)$ is the $L_{Zeq}(T, n)$ of the reference microphone, positioned on the ultrabook mock-up close to the corresponding i-th microphone position of the ultrabook in study, and
$f_{flat}(i)$ is the $f_{r\_mock}(i)$ for one-third octave band with the 1 kHz center frequency. An example of the reference microphone delta correction delta is depicted in FIG. 5. The corrected internal microphone delta for a particular certification, $d_c(i)$, can be defined as the addition of initial correction and reference microphone's delta (block 20) as:

$$d_c(i)=d(i)+d_r(i) \quad (4)$$

Figure 3B:
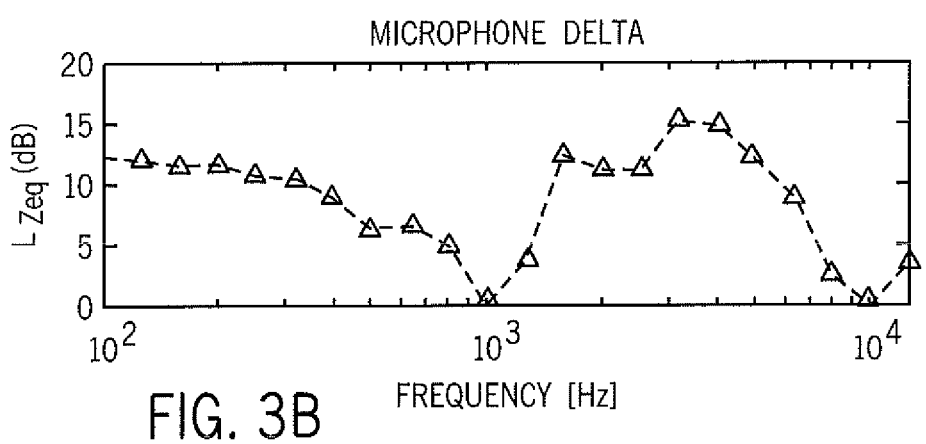
FIG. 3B presents a delta for the exemplary microphones of FIG. 3A.
Figure 6:
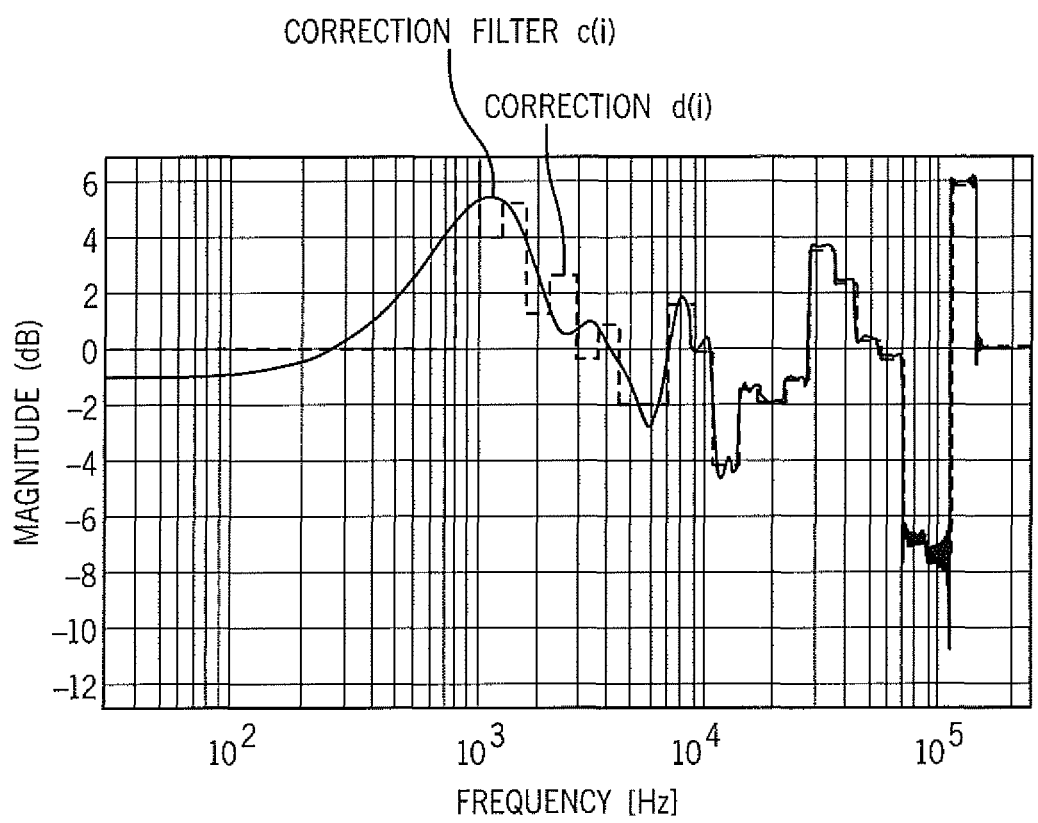
FIG. 6 is an example of a microphone correction and the correction filter $c_r(i)$.

In block 22, a correction filter $c_r(i)$ is designed as an finite impulse response (FIR) filter using the frequency sampling method of the reference microphone's delta, $d_c(i)$. This may be done by code that implements a well-known digital signal processing method, such as frequency sampling. Other filters may also be used, including, in bi-quad equalizers, an infinite impulse response (IIR) filter. The check at diamond 24 determines whether there is another microphone to calibrate. The FIR filter can be used in the Intel® Smart Sound Technology Audio DSP firmware (ADSP FW) (available from Intel Corporation, Santa Clara, Calif.) to correct, in real time, the data captured via the internal microphones. The FIR filter guarantees the linear phase response which is required by other processing blocks in the ADSP FW (e.g. beamformer). FIG. 6 presents both the $d_c(i)$ and the $c_r(i)$ calculated for the internal microphone used with FIG. 3.

Figure 7A:
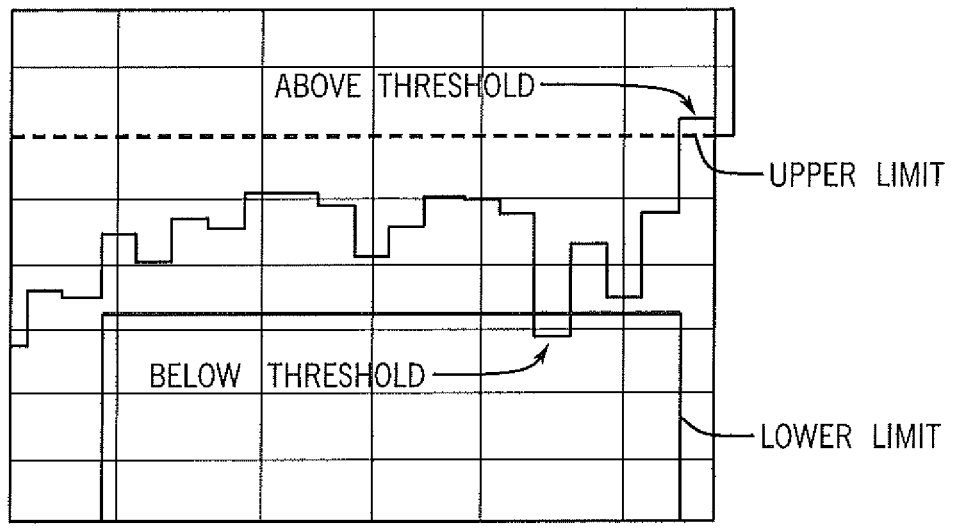
FIG. 7A is an example of uncorrected microphone frequency response.
Figure 7B:
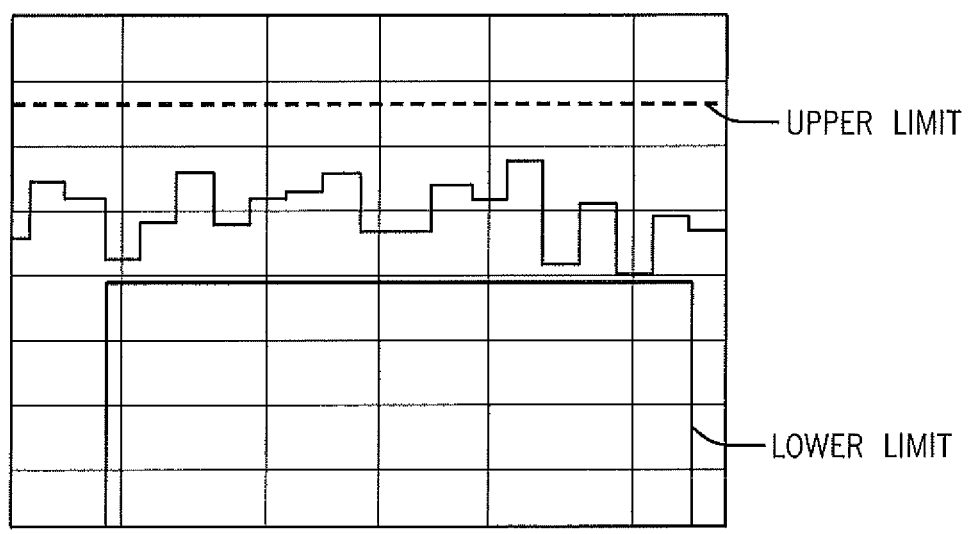
FIG. 7B is an example of a corrected microphone frequency response.

FIG. 7A represents the Skype test frequency response of the unprocessed internal microphone versus the corrected one (shown in FIG. 7B). The unprocessed version failed and the corrected one passed the Skype test because it is between the upper and lower limits of the test protocol.

As the microphone components can vary from one unit to another, the proposed automated calibration can be performed on several units. Then the mean value of the correction characteristics can be applied to the product line.

The processing techniques described herein may be implemented in various hardware architectures. For example, the functionality may be integrated within a chipset. Alternatively, a discrete processor may be used. As still another embodiment, the graphics functions may be implemented by a general purpose processor, including a multi-core processor.

Figure 8:
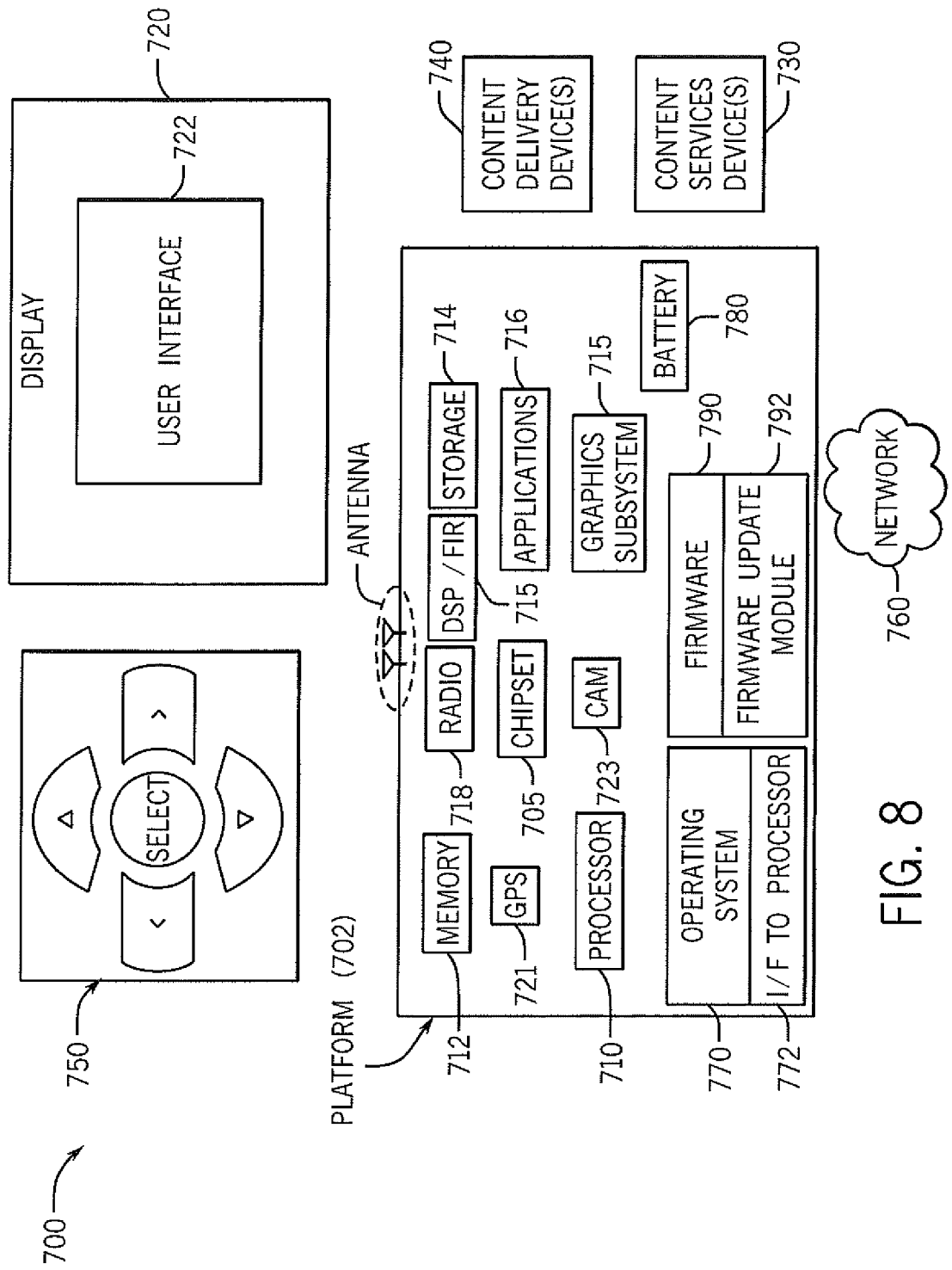
FIG. 8 is a system depiction for one embodiment.

FIG. 8 illustrates an embodiment of a system 700. In embodiments, system 700 may be a media system although system 700 is not limited to this context. For example, system 700 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In embodiments, system 700 comprises a platform 702 coupled to a display 720. Platform 702 may receive content from a content device such as content services device(s) 730 or content delivery device(s) 740 or other similar content sources. A navigation controller 750 comprising one or more navigation features may be used to interact with, for example, platform 702 and/or display 720. Each of these components is described in more detail below.

In embodiments, platform 702 may comprise any combination of a chipset 705, processor 710, memory 712, storage 714, graphics subsystem 715, applications 716 and/ or radio 718. Chipset 705 may provide intercommunication among processor 710, memory 712, storage 714, graphics subsystem 715, applications 716 and/or radio 718. For example, chipset 705 may include a storage adapter (not depicted) capable of providing intercommunication with storage 714.

Processor 710 may be implemented as Complex Instruction Set Computer (CISC) or Reduced Instruction Set Computer (RISC) processors, x86 instruction set compatible processors, multi-core, or any other microprocessor or central processing unit (CPU). In embodiments, processor 710 may comprise dual-core processor(s), dual-core mobile processor(s), and so forth. The processor may implement the sequence of FIG. 1, together with memory 712.

A digital signal processor (DSP) 715 may include a filter, such as an FIR filter to correct the microphone under test. The DSP may be coupled to the processor 710.

Memory 712 may be implemented as a volatile memory device such as, but not limited to, a Random Access Memory (RAM), Dynamic Random Access Memory (DRAM), or Static RAM (SRAM).

Storage 714 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In embodiments, storage 714 may comprise technology to increase the storage performance enhanced protection for valuable digital media when multiple hard drives are included, for example.

Graphics subsystem 715 may perform processing of images such as still or video for display. Graphics subsystem

715 may be a graphics processing unit (GPU) or a visual processing unit (VPU), for example. An analog or digital interface may be used to communicatively couple graphics subsystem 715 and display 720. For example, the interface may be any of a High-Definition Multimedia Interface, DisplayPort, wireless HDMI, and/or wireless HD compliant techniques. Graphics subsystem 715 could be integrated into processor 710 or chipset 705. Graphics subsystem 715 could be a stand-alone card communicatively coupled to chipset 705.

The graphics and/or video processing techniques described herein may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

Radio 718 may include one or more radios capable of transmitting and receiving signals using various suitable wireless communications techniques. Such techniques may involve communications across one or more wireless networks. Exemplary wireless networks include (but are not limited to) wireless local area networks (WMANs), wireless personal area networks (WPANs), wireless metropolitan area network (WMANs), cellular networks, and satellite networks. In communicating across such networks, radio 718 may operate in accordance with one or more applicable standards in any version.

In embodiments, display 720 may comprise any television type monitor or display. Display 720 may comprise, for example, a computer display screen, touch screen display, video monitor, television-like device, and/or a television. Display 720 may be digital and/or analog. In embodiments, display 720 may be a holographic display. Also, display 720 may be a transparent surface that may receive a visual projection. Such projections may convey various forms of information, images, and/or objects. For example, such projections may be a visual overlay for a mobile augmented reality (MAR) application. Under the control of one or more software applications 716, platform 702 may display user interface 722 on display 720.

In embodiments, content services device(s) 730 may be hosted by any national, international and/or independent service and thus accessible to platform 702 via the Internet, for example. Content services device(s) 730 may be coupled to platform 702 and/or to display 720. Platform 702 and/or content services device(s) 730 may be coupled to a network 760 to communicate (e.g., send and/or receive) media information to and from network 760. Content delivery device(s) 740 also may be coupled to platform 702 and/or to display 720.

In embodiments, content services device(s) 730 may comprise a cable television box, personal computer, network, telephone, Internet enabled devices or appliance capable of delivering digital information and/or content, and any other similar device capable of unidirectionally or bidirectionally communicating content between content providers and platform 702 and/display 720, via network 760 or directly. It will be appreciated that the content may be communicated unidirectionally and/or bidirectionally to and from any one of the components in system 700 and a content provider via network 760. Examples of content may include any media information including, for example, video, music, medical and gaming information, and so forth.

Content services device(s) 730 receives content such as cable television programming including media information, digital information, and/or other content. Examples of content providers may include any cable or satellite television or radio or Internet content providers. The provided examples are not meant to limit the applicable embodiments.

In embodiments, platform 702 may receive control signals from navigation controller 750 having one or more navigation features. The navigation features of controller 750 may be used to interact with user interface 722, for example. In embodiments, navigation controller 750 may be a pointing device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 750 may be echoed on a display (e.g., display 720) by movements of a pointer, cursor, focus ring, or other visual indicators displayed on the display. For example, under the control of software applications 716, the navigation features located on navigation controller 750 may be mapped to virtual navigation features displayed on user interface 722, for example. In embodiments, controller 750 may not be a separate component but integrated into platform 702 and/or display 720. Embodiments, however, are not limited to the elements or in the context shown or described herein.

In embodiments, drivers (not shown) may comprise technology to enable users to instantly turn on and off platform 702 like a television with the touch of a button after initial boot-up, when enabled, for example. Program logic may allow platform 702 to stream content to media adaptors or other content services device(s) 730 or content delivery device(s) 740 when the platform is turned "off." In addition, chip set 705 may comprise hardware and/or software support for 5.1 surround sound audio and/or high definition 7.1 surround sound audio, for example. Drivers may include a graphics driver for integrated graphics platforms. In embodiments, the graphics driver may comprise a peripheral component interconnect (PCI) Express graphics card.

In various embodiments, any one or more of the components shown in system 700 may be integrated. For example, platform 702 and content services device(s) 730 may be integrated, or platform 702 and content delivery device(s) 740 may be integrated, or platform 702, content services device(s) 730, and content delivery device(s) 740 may be integrated, for example. In various embodiments, platform 702 and display 720 may be an integrated unit. Display 720 and content service device(s) 730 may be integrated, or display 720 and content delivery device(s) 740 may be integrated, for example. These examples are not meant to be scope limiting.

In various embodiments, system 700 may be implemented as a wireless system, a wired system, or a combination of both. When implemented as a wireless system, system 700 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 700 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Platform 702 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 8.

Figure 9:
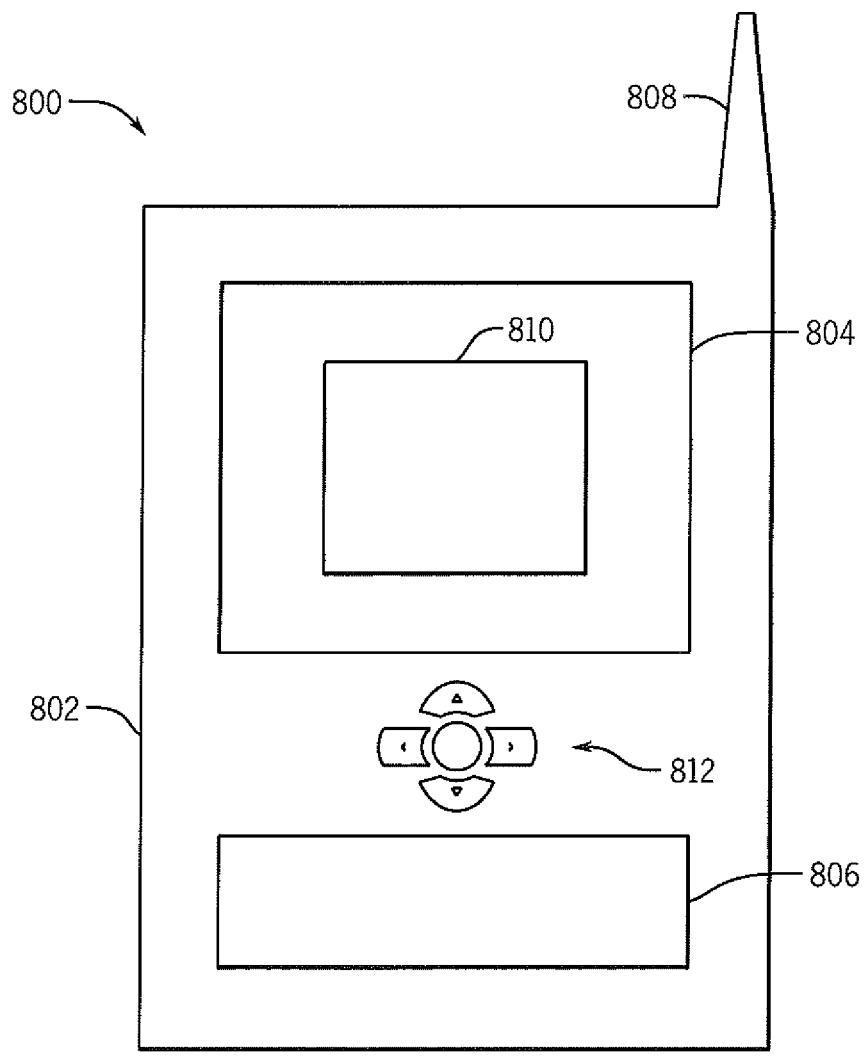
FIG. 9 is a front elevation of one embodiment.

As described above, system 700 may be embodied in varying physical styles or form factors. FIG. 9 illustrates embodiments of a small form factor device 800 in which system 700 may be embodied. In embodiments, for example, device 800 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

The following clauses and/or examples pertain to further embodiments:

One example of an embodiment may be a method including automatically measuring a frequency response of a microphone in a device under test, automatically measuring a frequency response of a reference microphone, automatically subtracting the frequency responses to derive a delta, automatically calculating a delta correction based on the frequency response of the reference microphone, and automatically correcting the microphone under test using a filter designed based on the delta correction. The method may also include adding the delta corrections of the reference microphone and microphone under test to determine a delta correction for the filter. The method may also include measuring the frequency responses in one third octave bands. The method may also include determining a delta correction based on position of the microphone under test. The method may also include determining corrections for a plurality of microphones under test and taking a mean value of said corrections to set a correction for commercial microphone production. The method may also include using a finite impulse response filter as the filter. The method may also include using an equivalent continuing sound level to represent the frequency response of the reference microphone. The method may also include automatically correcting by using only the device under test. The method may also include using only a reference microphone, a loudspeaker, and the device under test to perform the steps of claim 1.

Another example embodiment may be one or more non-transitory computer readable media storing instructions executed by a processor to perform a sequence comprising measuring a frequency response of a microphone in a device under test, measuring a frequency response of a reference microphone, subtracting the frequency responses to derive a delta, calculating a delta correction based on the frequency response of the reference microphone, and correcting the microphone under test using a filter designed based on the delta correction. The media may also include adding the delta corrections of the reference microphone and microphone under test to determine a delta correction for the filter. The media may also include measuring the frequency responses in one third octave bands. The media may also include determining a delta correction based on position of the microphone under test. The media may also include determining corrections for a plurality of microphones under test and taking a mean value of said corrections to set a correction for commercial microphone production. The media may also include using digital signal processing to implement said filter. The media may also include using an equivalent continuing sound level to represent the frequency response of the reference microphone. The media may also include automatically correcting by using only the device under test. The media may also include using only a reference microphone, a loudspeaker, and the device under test to perform the steps of claim 1.

Yet another example embodiment may be an apparatus comprising a computer, a loudspeaker coupled to said computer, a reference microphone coupled to said computer, said computer to correct a microphone under test by performing a sequence comprising measuring a frequency response of a microphone in a device under test, measuring a frequency response of a reference microphone, subtracting the frequency responses to derive a delta, calculating a delta correction based on the frequency response of the reference microphone, and correcting the microphone under test using a filter designed based on the delta correction. The apparatus may include wherein said computer includes a finite impulse response filter. The apparatus may include adding the delta corrections of the reference microphone and microphone under test to determine a delta correction for the filter. The apparatus may include measuring the frequency responses in one third octave bands. The apparatus may include determining a delta correction based on position of the microphone under test. The apparatus may include determining corrections for a plurality of microphones under test and taking a mean value of said corrections to set a correction for commercial microphone production. The apparatus may include a finite impulse response filter. The apparatus may include using an equivalent continuing sound level to represent the frequency response of the reference microphone.

The apparatus may include automatically correcting by using only the device under test. The apparatus may include using only a reference microphone, a loudspeaker, and the device under test to perform the steps of claim 1. The apparatus may include a battery. The apparatus may include firmware and a module to update said firmware.

References throughout this specification to "one embodiment" or "an embodiment" mean that a particular feature, structure, or characteristic described in connection with the embodiment is included in at least one implementation encompassed within the present disclosure. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While a limited number of embodiments have been described, those skilled in the art will appreciate numerous modifications and variations therefrom. It is intended that the appended claims cover all such modifications and variations as fall within the true spirit and scope of this disclosure.

What is claimed is:

1. A method comprising:
   automatically measuring a frequency response of a microphone in a device under test;
   automatically measuring a frequency response of a reference microphone;
   automatically subtracting the frequency responses to derive a delta;
   automatically calculating a delta correction based on the frequency response of the reference microphone;
   automatically correcting the microphone under test using a filter designed based on the delta correction; and
   determining corrections for a plurality of microphones under test and taking a mean value of said corrections to set a correction for commercial microphone production.

2. The method of claim 1 including adding the delta corrections of the reference microphone and microphone under test to determine a delta correction for the filter.

3. The method of claim 1 including measuring the frequency responses in one third octave bands.

4. The method of claim 1 including determining a delta correction based on position of the microphone under test.

5. The method of claim 1 including using a finite impulse response filter as the filter.

6. The method of claim 1 including using an equivalent continuing sound level to represent the frequency response of the reference microphone.

7. The method of claim 1 including automatically correcting by using only the device under test.

8. The method of claim 1 including using only a reference microphone, a loudspeaker, and the device under test to perform the steps of claim 1.

9. One or more non-transitory computer readable media storing instructions executed by a processor to perform a sequence comprising:
   measuring a frequency response of a microphone in a device under test;
   measuring a frequency response of a reference microphone;
   subtracting the frequency responses to derive a delta;
   calculating a delta correction based on the frequency response of the reference microphone;
   correcting the microphone under test using a filter designed based on the delta correction; and
   adding the delta corrections of the reference microphone and microphone in the device under test to determine a delta correction for the filter.

10. The media of claim 9, said sequence including measuring the frequency responses in one third octave bands.

11. The media of claim 9, said sequence including determining a delta correction based on position of the microphone in the device under test.

12. The media of claim 9, said sequence including determining corrections for a plurality of microphones under test and taking a mean value of said corrections to set a correction for commercial microphone production.

13. The media of claim 9, said sequence including using digital signal processing to implement said filter.

14. The media of claim 9, said sequence including using an equivalent continuing sound level to represent the frequency response of the reference microphone.

15. The media of claim 9, said sequence including automatically correcting by using only the device under test.

16. The media of claim 9, said sequence including using only a reference microphone, a loudspeaker, and the device under test to perform the steps of claim 1.

17. An apparatus comprising:
   a computer;
   a loudspeaker coupled to said computer;
   a reference microphone coupled to said computer;
   said computer to correct a microphone under test by performing a sequence comprising:
      measuring a frequency response of the microphone under test;
      measuring a frequency response of a reference microphone;
      subtracting the frequency responses to derive a delta;
      calculating a delta correction based on the frequency response of the reference microphone;
      correcting the microphone under test using a filter designed based on the delta correction; and
      using an equivalent continuing sound level to represent the frequency response of the reference microphone.

18. The apparatus of claim 17 wherein said computer includes a finite impulse response filter.

19. The apparatus of claim 17, said sequence including adding the delta corrections of the reference microphone and microphone under test to determine a delta correction for the filter.

20. The apparatus of claim 17, said sequence including measuring the frequency responses in one third octave bands.

21. The apparatus of claim 17, said sequence including determining a delta correction based on position of the microphone under test.

22. The apparatus of claim 17, said sequence including determining corrections for a plurality of microphones under test and taking a mean value of said corrections to set a correction for commercial microphone production.

23. The apparatus of claim 17, said sequence including a finite impulse response filter.

24. The apparatus of claim 17, said sequence including automatically correcting by using only the computer.

25. The apparatus of claim 17, said sequence including using only a reference microphone, a loudspeaker, and the computer to perform the steps of claim 1.

26. The apparatus of claim 17 including a battery.

27. The apparatus of claim 17 including firmware and a module to update said firmware.

* * * * *